United States Patent
Hsieh et al.

(10) Patent No.: US 6,444,034 B1
(45) Date of Patent: Sep. 3, 2002

(54) APPARATUS FOR ELIMINATING ELECTROSTATIC DESTRUCTION

(75) Inventors: Yi-Chang Hsieh; Lai-Fue Hsieh, both of Hsinchu; Mu-Sheng Liao, Hsinchu Hsien; Ching-Jung Huang, Hsinchu, all of (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 09/569,317

(22) Filed: May 11, 2000

(51) Int. Cl.[7] .............................................. B05B 5/025
(52) U.S. Cl. ....................... 118/676; 118/621; 118/314; 118/324
(58) Field of Search ................................ 118/676, 678, 118/684, 687, 620, 621, 324, 314; 427/96

(56) References Cited

U.S. PATENT DOCUMENTS 4,695,482 A * 9/1987 Weiswurm .................. 118/676
5,215,130 A * 6/1993 Kojima et al. .............. 141/105
5,236,746 A * 8/1993 Kapp-Schwoerer et al. 427/508
6,132,809 A * 10/2000 Hynes et al. ............... 427/421

* cited by examiner

Primary Examiner—Richard Crispino
Assistant Examiner—Yewebdar T Tadesse
(74) Attorney, Agent, or Firm—Ladas & Parry

(57) ABSTRACT

An apparatus for preventing electrostatic destruction of integrated circuits coats an electrostatic agent on surfaces of the integrated circuits to avoid accumulation of static electricity caused by dynamic contact friction. The apparatus comprises a belt, at least one motor, at least one spray nozzle, at least one dispenser or controller and at least one photo switch. The integrated circuits are placed on the belt. The motor drives the belt and therefore the integrated circuits step by step to the spray nozzle to coat the electrostatic agent on the surfaces of the integrated circuits. The controller controls the output rate of the electrostatic agent from the spray nozzle. The photo switch is connected to the spray nozzle and dispenser to detect the integrated circuits as they pass the spray nozzle.

3 Claims, 2 Drawing Sheets

APPARATUS FOR ELIMINATING ELECTROSTATIC DESTRUCTION

BACKGROUND OF THE INVENTION

1. Field of the invention

The present invention relates to an apparatus for eliminating electrostatic destruction, and particularly to an automatic apparatus for eliminating electrostatic destruction by coating an electrostatic agent on surfaces of integrated circuits.

2. Description of the related art

In general, a reaction of integrated circuits to static electricity is sensitive. The correctness of computation results and even the life of the integrated circuits will be affected by accumulation of static electricity. Therefore, how to prevent from the accumulation of static electricity is an important topic during a process of manufacturing the integrated circuits.

FIG. 1 is a prior apparatus for preventing from electrostatic destruction. The prior method is to put finished integrated circuits inside a disk 11, and two ends of the disk 11 are wrapped with two electrostatic belts. The electrostatic belts 12 are immersed first in an electrostatic agent which can prevent the integrated circuits inside the disk 11 from accumulation of static electricity.

There are different effects of electrostatic prevention for the integrated circuits of different positions inside the disk 11 shown in FIG. 1. Usually, integrated circuits near the electrostatic belts 12 have a better effect of electrostatic prevention, and integrated circuits positioned away from the electrostatic belts 12 have a worse effect of electrostatic prevention. Besides, the protecting mode of the electrostatic belts 12 is static. This means that it is suitable to prevent from the accumulation of static electricity caused by an outside environment, such as dry weather.

For some dynamic situations, such as accumulation of static electricity caused by contact friction between an integrated circuit and a machine arm during the stage of packaging, testing and surface mounting the circuit, the prior method can not prevent from the accumulation of static electricity caused by the dynamic situations.

From the above descriptions, the apparatus for static electricity protection can not satisfy the needs of the market.

SUMMARY OF THE INVENTION

Accordingly, an object of the present invention is to resolve the non-uniform problem of electrostatic protection and electrostatic destruction caused by contact friction for integrated circuits in prior art. In order to accomplish the object, the present invention proposes an apparatus for preventing from electrostatic destruction. The apparatus coats the electrostatic agent directly on the surface of integrated circuits, therefore eliminating the accumulation of static electricity caused by dynamical contact friction.

The present apparatus for eliminating electrostatic destruction mainly comprises a belt, at least one motor, at least one spray nozzle, at least one dispenser and at least one photo switch. The integrated circuits are placed on the belt. The motor is used to drive the belt forwards, and therefore the integrated circuits can move forwards step by step. The spray nozzle is used to coat the electrostatic agent on the surface of the integrated circuits. The dispenser is used to control the output rate of the electrostatic agent from the spray nozzle. The photo switch is connected to the spray nozzle and dispenser to detect if the integrated circuits pass the spray nozzle.

BRIEF DESCRIPTION OF THE DRAWINGS

The present invention will be described according to the appended drawings in which.

PREFERRED EMBODIMENT OF THE PRESENT INVENTION

The prior apparatus uses two electrostatic belts 12 immersed in an electrostatic agent for preventing the integrated circuits from accumulation of static electricity, but the prior apparatus can not prevent from the static electricity destruction caused by contact friction between an automatic machine and integrated circuits 13. For overcoming the electrostatic destruction caused by contact friction between the automatic machine and integrated circuits 13, the effective way is to coat the electrostatic agent on surfaces of the integrated circuits 13. Because of the protection by the electrostatic agent, the static electricity caused by contact friction between the automatic machine and the integrated circuits 13 is not easy to accumulate on the surfaces of the integrated circuit as before, and the effect of protecting integrated circuits from damage caused by static electricity will be achieved.

Table 1 shows a comparison result of the capabilities of overcoming the accumulated static electricity between the prior apparatus and the present invention. The test conditions are 22° C. in temperature and 55% in humidity. The experiments are done for forty eight times, and each time two integrated circuits coated with electrostatic agent and without electrostatic agent are rubbed for five seconds. Then, the residual static electricity on the surfaces of the integrated circuits is measured immediately.

Table 1 is therefore obtained.

TABLE 1

| | The measured results (Unit: Volt) | | | | | | | |
|---|---|---|---|---|---|---|---|---|
| without coating electrostatic agent | 330 V | 250 V | 300 V | 210 V | 260 V | 200 V | 280 V | 360 V |
| | 170 V | 290 V | 340 V | 280 V | 760 V | 330 V | 1060 V | 620 V |
| | 530 V | 590 V | 200 V | 780 V | 240 V | 370 V | 250 V | 260 V |
| | 370 V | 350 V | 230 V | 210 V | 430 V | 220 V | 340 V | 280 V |
| | 210 V | 130 V | 170 V | 250 V | 200 V | 330 V | 350 V | 250 V |
| | 220 V | 740 V | 230 V | 290 V | 230 V | 780 V | 200 V | 200 V |
| coating electrostatic agent | 20 V | 20 V | 20 V | 20 V | 20 V | 20 V | 20 V | 20 V |
| | 30 V | 30 V | 30 V | 20 V | 20 V | 20 V | 10 V | 10 V |

TABLE 1-continued

| The measured results (Unit: Volt) | | | | | | | |
|---|---|---|---|---|---|---|---|
| 20 V | 20 V | 20 V | 20 V | 20 V | 20 V | 20 V | 20 V |
| 20 V | 20 V | 30 V | 20 V | 20 V | 20 V | 20 V | 20 V |
| 20 V | 20 V | 20 V | 20 V | 20 V | 20 V | 20 V | 10 V |
| 20 V | 20 V | 20 V | 20 V | 20 V | 20 V | 20 V | 20 V |

Figure 1:
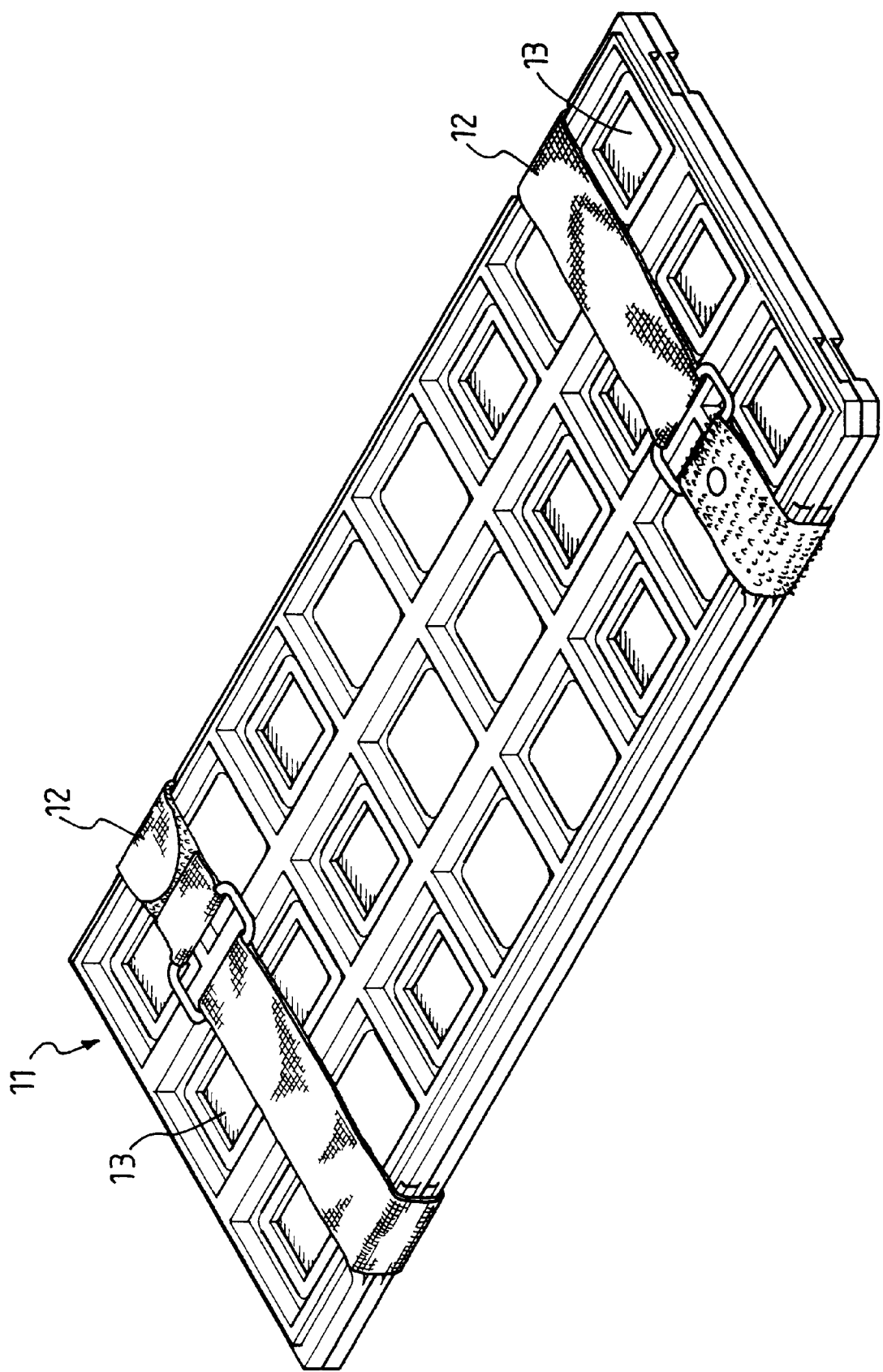
FIG. 1 is a prior apparatus for preventing from electrostatic destruction.

Through the comparison result in FIG. 1, it can be found that the ability of the present invention to overcome the accumulation of static electricity is better than the ability of the prior apparatus to overcome the accumulation of static electricity.

Figure 2:
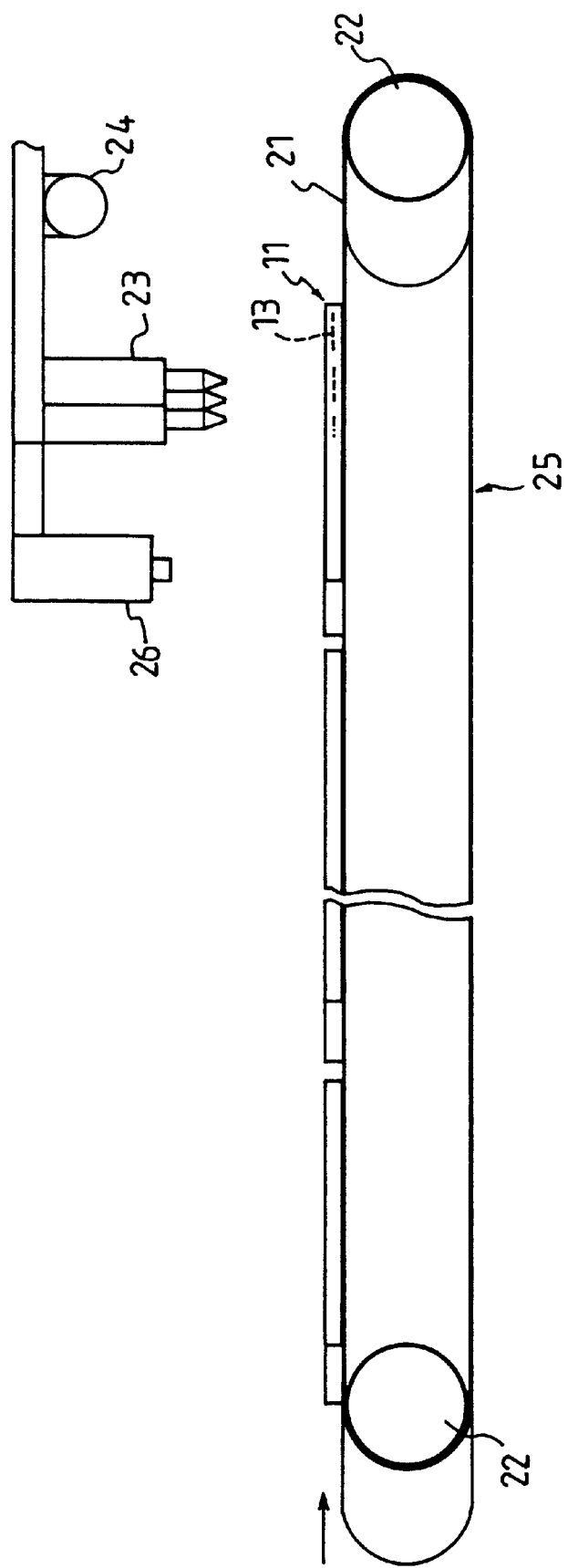
FIG. 2 is a schematic diagram of the apparatus for preventing from electrostatic destruction according to a preferred embodiment of the present invention.

FIG. 2 is a schematic diagram of the apparatus for preventing from electrostatic destruction according to a preferred embodiment of the present invention. A plurality of integrated circuits 13 are placed on the top 21 of a belt 25. The integrated circuits 13 can be placed on the central part of a disk 11. The action of coating electrostatic agent can be in any stage of whole packaging and testing process, preferably at the end of packaging step and at the start of testing step. At least one motor 22 is placed at one end of the belt 25 to drive the belt 25 forwards. Therefore, the integrated circuits 13 on the top of the belt 25 are delivered forward. At the other end of the belt 25, a cylinder is disposed. If the belt 25 is so long that the belt can not be driven forwards by one motor only, the cylinder can be replaced by a motor. The motors 22 can be operated in an intermittent movement to move said integrated circuits on the top of the belt intermittently. At least one spray nozzle 23 is used to coat the electrostatic agent on the surface of the integrated circuits. The coating method of the spray nozzle 23 can be a way of spraying a gas-like or liquid-like electrostatic agent, and the present invention is not limited to the way. At least one dispenser 24 is connected to the spray nozzle 23 to control the output rate of the electrostatic agent from the spray nozzle 23. The number of the spray nozzles 23 and dispensers 24 can be more than one to coat concurrently the electrostatic agent on the surface of the integrated circuits 13 inside the disk 11. At least one photo switch 26 is connected to the spray nozzles 23 and dispensers 24 to detect if the integrated circuits 13 arrive at the spray nozzles 23. If the answer is yes, the photo switch 26 will force the dispensers 24 to coat the electricity-preventing agent on the surface of the integrated circuits 13.

The above-described embodiments of the present invention are intended to be illustrated only. Numerous alternative embodiments may be devised by those skilled in the art without departing from the scope of the following claims.

What is claimed is:

1. In an apparatus for eliminating electrostatic destruction by coating an electrostatic agent on the surfaces of integrated circuits, the improvements comprising:
    a belt on which said integrated circuits are placed;
    at least one motor for driving said belt forwards, thereby moving the integrated circuits forwards;
    at least one spray nozzle for coating said electrostatic agent on a surface of the integrated circuits;
    at least one controller for controlling the output rate of said electrostatic agent from said spray nozzle; and
    at least one photo switch mechanically connected to said spray nozzle and dispenser and for detecting if said integrated circuits arrive at said spray nozzle.

2. The apparatus of claim 1, wherein said at least one motor is operated in an intermittent movement, thereby sequentially coating the electrostatic agent on the surfaces of said integrated circuits on said belt by said spray nozzle.

3. In an apparatus for reducing electrostatic destruction from surfaces of integrated circuits, the improvements comprising:
    a mechanism for moving successive integrated circuits into a position;
    at least one spray nozzle for coating an electrostatic agent on a surface of an integrated circuit when detected in said position;
    a least one controller for controlling the output rate of said electrostatic agent from said spray nozzle; and
    at least one switch mechanically connected to said spray nozzle and dispenser and for detecting said integrated circuits in said position.

* * * * *